United States Patent
Schwarzenbacher et al.

(10) Patent No.: US 10,134,611 B2
(45) Date of Patent: Nov. 20, 2018

(54) COLLECTOR FOR USE WITH AN APPARATUS FOR TREATING WAFER-SHAPED ARTICLES

(71) Applicant: LAM RESEARCH AG, Villach (AT)

(72) Inventors: Reinhold Schwarzenbacher, Carinthia (AT); Ulrich Tschinderle, Carinthia (AT)

(73) Assignee: LAM RESEARCH AG, Villach (AT)

( * ) Notice: Subject to any disclaimer, the term of this patent is extended or adjusted under 35 U.S.C. 154(b) by 954 days.

(21) Appl. No.: 13/849,072

(22) Filed: Mar. 22, 2013

(65) Prior Publication Data
US 2014/0283935 A1    Sep. 25, 2014

(51) Int. Cl.
*H01L 21/67* (2006.01)

(52) U.S. Cl.
CPC ... *H01L 21/67051* (2013.01); *Y10T 137/8593* (2015.04)

(58) Field of Classification Search
CPC .................. H01L 21/67005; H01L 21/67051
USPC ....................................... 137/312; 118/50, 52
See application file for complete search history.

(56) References Cited

U.S. PATENT DOCUMENTS

| | | | |
|---|---|---|---|
| 4,903,717 A | 2/1990 | Sumnitsch | |
| 6,572,701 B2* | 6/2003 | Yamauchi et al. | 118/52 |
| 7,837,803 B2 | 11/2010 | Hohenwarter | |
| 2003/0010671 A1* | 1/2003 | Orii et al. | 206/710 |
| 2004/0050491 A1* | 3/2004 | Miya et al. | 156/345.11 |
| 2010/0175722 A1* | 7/2010 | Salinas et al. | 134/22.18 |

* cited by examiner

*Primary Examiner* — Craig Schneider
*Assistant Examiner* — Kevin Barss

(57) ABSTRACT

A collector assembly for use with a spin chuck includes a base component, a top component and a first intermediate component configured to be fitted between the base component and the top component. The base, top and first intermediate components are configured so as to be interconnectable to form a process enclosure and so as to be separable from one another. The base component and the intermediate component each comprise collector wall segments such that when the base, top and first intermediate components are interfitted, the wall segments together define an outer side wall of the collector assembly.

17 Claims, 4 Drawing Sheets

COLLECTOR FOR USE WITH AN APPARATUS FOR TREATING WAFER-SHAPED ARTICLES

BACKGROUND OF THE INVENTION

1. Field of the Invention

The invention relates generally to apparatus for treating surfaces of wafer-shaped articles, such as semiconductor wafers, and more particularly for collector structures for use with such apparatus.

2. Description of Related Art

Semiconductor wafers are subjected to various surface treatment processes such as etching, cleaning, polishing and material deposition. To accommodate such processes, a single wafer may be supported in relation to one or more treatment fluid nozzles by a chuck associated with a rotatable carrier. Such chucks are often equipped with a surrounding collector for gathering used liquids and exhaust gases generated by the processes. Examples of such collectors are shown in FIG. 3 of U.S. Pat. No. 4,903,717 and U.S. Pat. No. 7,837,803.

These collectors include a plurality of process levels, which in practice is most commonly three. The spin chuck can be moved relative to the collector between each of these three process levels, as well as to an uppermost loading and unloading position.

However, in some cases only one or two processing compositions are utilized for a given spin chuck, in which case not all of the three levels are used. Furthermore, in the conventional collector designs, cleaning and repair of any part of the collector would place the entire collector out of service.

SUMMARY OF THE INVENTION

Thus, the invention in one aspect relates to a collector assembly for use with a spin chuck, the collector assembly comprising a base component, a top component and a first intermediate component configured to be fitted between the base component and the top component. The base component, top component and first intermediate component are configured so as to be interconnectable to form a process enclosure and so as to be separable from one another. The base component and the intermediate component each comprise collector wall segments such that when the base component, top component and first intermediate component are interfitted, the wall segments together define an outer side wall of the collector.

In preferred embodiments of the collector assembly according to the present invention, the base component comprises a radially inner trough for collecting process liquid and a radially outer annular duct for collecting exhaust process gas.

In preferred embodiments of the collector assembly according to the present invention, a lower portion of the top component is formed as a deflector having a downwardly facing annular surface that directs process fluids radially outwardly and downwardly toward a drainage channel formed in the collector assembly.

In preferred embodiments of the collector assembly according to the present invention, an upper deflector is fitted between the top component and the first intermediate component, the upper deflector having a downwardly facing annular surface that directs process fluids radially outwardly and downwardly toward a drainage channel formed in the collector assembly.

In preferred embodiments of the collector assembly according to the present invention, a lower portion of the first intermediate component is formed as a deflector having a downwardly facing annular surface that directs process fluids radially outwardly and downwardly toward a drainage channel formed in the collector assembly.

In preferred embodiments of the collector assembly according to the present invention, a lower deflector is fitted between the first intermediate component and the base component, the lower deflector having a downwardly facing annular surface that directs process fluids radially outwardly and downwardly toward a drainage channel formed in the collector assembly.

In preferred embodiments of the collector assembly according to the present invention, the first intermediate component is configured so as to sealingly interfit at an upper end with the top component and to sealingly interfit at a lower end with the base component.

In preferred embodiments of the collector assembly according to the present invention, the collector assembly also includes a second intermediate component configured so as to sealingly interfit at an upper end with a lower end of the first intermediate component and to sealingly interfit at a lower end with the base component, the second intermediate component comprising a further collector wall segment such that when the base component, top component and first and second intermediate components are interfitted, the wall segments together define an outer side wall of the collector.

In preferred embodiments of the collector assembly according to the present invention, the first intermediate component comprises a radially inner trough for collecting process liquid and a radially outer annular duct for collecting exhaust process gas.

In preferred embodiments of the collector assembly according to the present invention, the second intermediate component comprises a radially inner trough for collecting process liquid and a radially outer annular duct for collecting exhaust process gas.

In preferred embodiments of the collector assembly according to the present invention, at least one drain conduit is fitted in the radially outer annular duct of the base component and has an upper end configured to interfit with a drain formed in the trough of the first intermediate component, such that process liquid collected by the first intermediate component passes through the radially outer annular duct of the base component without being exposed to exhaust gases in the radially outer duct of the base component.

In preferred embodiments of the collector assembly according to the present invention, at least one drain conduit is fitted in the radially outer annular duct of the base component and has an upper end configured to interfit with a lower end of a drain conduit formed in the second intermediate component, the drain conduit of the second intermediate component being configured to interfit with a drain formed in the trough of the first intermediate component, such that process liquid collected by the first intermediate component passes through the radially outer annular duct of the second intermediate component and the base component without being exposed to exhaust gases in the radially outer duct of the second intermediate component or the base component.

In preferred embodiments of the collector assembly according to the present invention, the base component comprises an upstanding partition dividing a radially inner trough of the base component from a radially outer annular duct of the base component.

In preferred embodiments of the collector assembly according to the present invention, the first intermediate component comprises an upstanding partition dividing the radially inner trough of the first intermediate component from the radially outer annular duct of the first intermediate component.

In preferred embodiments of the collector assembly according to the present invention, the second intermediate component comprises an upstanding partition dividing the radially inner trough of the second intermediate component from the radially outer annular duct of the second intermediate component.

In preferred embodiments of the collector assembly according to the present invention, an exhaust system is provided for venting exhaust gases from the radially outer annular duct of the base, and the first intermediate component, wherein the radially outer annular duct of the base and first intermediate components are sealed off from one another, and wherein the exhaust system is configured to withdraw exhaust gas separately and independently from the radially outer annular duct of the base and first intermediate components.

In preferred embodiments of the collector assembly according to the present invention, an exhaust system is provided for venting exhaust gases from the radially outer annular duct of the base, and the first intermediate component, wherein the radially outer annular duct of the base and first intermediate components are in gaseous communication one another, and wherein the exhaust system is configured to withdraw exhaust gas separately and conjointly from the radially outer annular duct of the base and first intermediate components.

BRIEF DESCRIPTION OF THE DRAWINGS

Other objects, features and advantages of the invention will become more apparent after reading the following detailed description of preferred embodiments of the invention, given with reference to the accompanying drawings, in which.

DETAILED DESCRIPTION OF PREFERRED EMBODIMENTS

Figure 1:
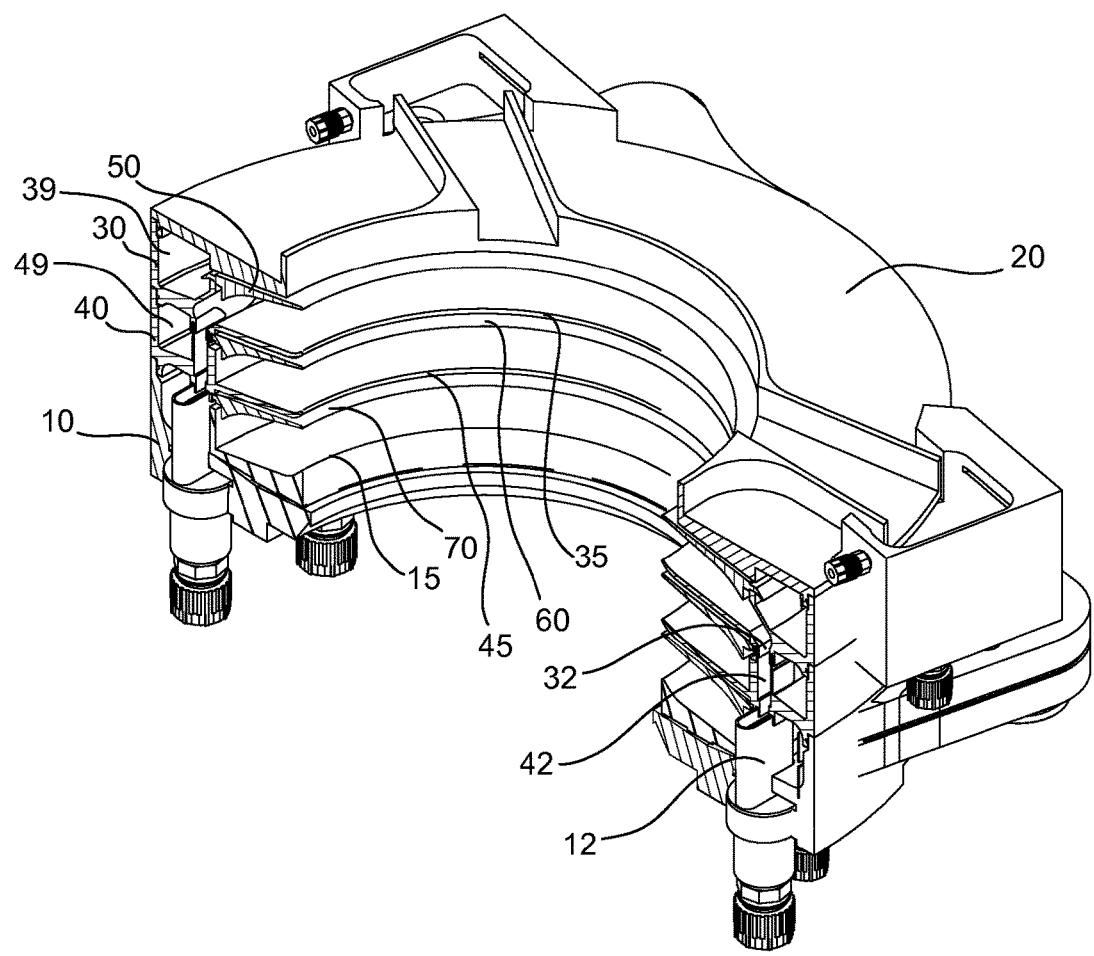
FIG. 1 is a perspective view of a collector assembly in axial cross-section, according to a first embodiment of the present invention.

In FIG. 1 a collector assembly comprises four principal components, namely, the base component 10, top component 20, first intermediate component 30 and second intermediate component 40. The half of the collector assembly not visible in FIG. 1 is generally a mirror image of that shown, as can be seen from the exploded view of FIG. 2.

The collector assembly of FIG. 1 also includes upper deflector 50, middle deflector 60 and lower deflector 70, whose structure and function will be described hereinbelow; however, these parts are optional.

As is known to those skilled in the art, the collector assembly of FIG. 1 in use surrounds a spin chuck, such as those utilized for single wafer wet processing of semiconductor wafers, as described for example in U.S. Pat. Nos. 4,903,717 and 7,837,803. Such spin chucks are designed to hold wafers of a predetermined diameter, with 300 mm and 450 mm being diameters currently in use and under present development. The spin chuck is movable relative to the collector between each of three collector levels, as well as an uppermost loading and unloading position. The relative movement between collector assembly and spin chuck may be achieved either by raising and lowering the spin chuck relative to a stationary collector assembly, or by raising and lowering the collector assembly relative to a stationary spin chuck, or by simultaneously raising or lowering both the spin chuck and the collector assembly in opposite directions or at differing speeds in the same direction.

Therefore, a lowermost process level corresponds to the position in which a spin chuck has its upper surface approximately flush with the radially inner upper edge 15 of the base component 10. The sloping surface that begins at that edge serves to collect liquid flung off of the surface of a wafer, and direct it to a drain in the base component.

The optional deflector 70 will also direct liquid downwardly and outwardly toward the drain in base component 10, and moreover defines a gap between itself and the lower facing surface of the second intermediate component 40, through which exhaust gas may be pulled into the outer exhaust ducts of the collector assembly.

A middle process level corresponds to the position in which a spin chuck has its upper surface approximately flush with the radially inner edge 45 of the second intermediate component 40. The sloping surface that begins at that edge likewise serves to collect liquid flung off of the surface of a wafer, and direct it to a drain in the second intermediate component 40.

In this case the optional middle deflector 60 will also direct liquid downwardly and outwardly toward the drain in the second intermediate component 40, and moreover defines a gap between itself and the lower facing surface of the first intermediate component 30, through which exhaust gas may be pulled into the outer exhaust ducts of the collector assembly.

Similarly, an upper process level corresponds to the position in which a spin chuck has its upper surface approximately flush with the radially inner edge 35 of the first intermediate component 30. The sloping surface that begins at that edge likewise serves to collect liquid flung off of the surface of a wafer, and direct it to a drain 32 in the first intermediate component 30.

Figure 2:
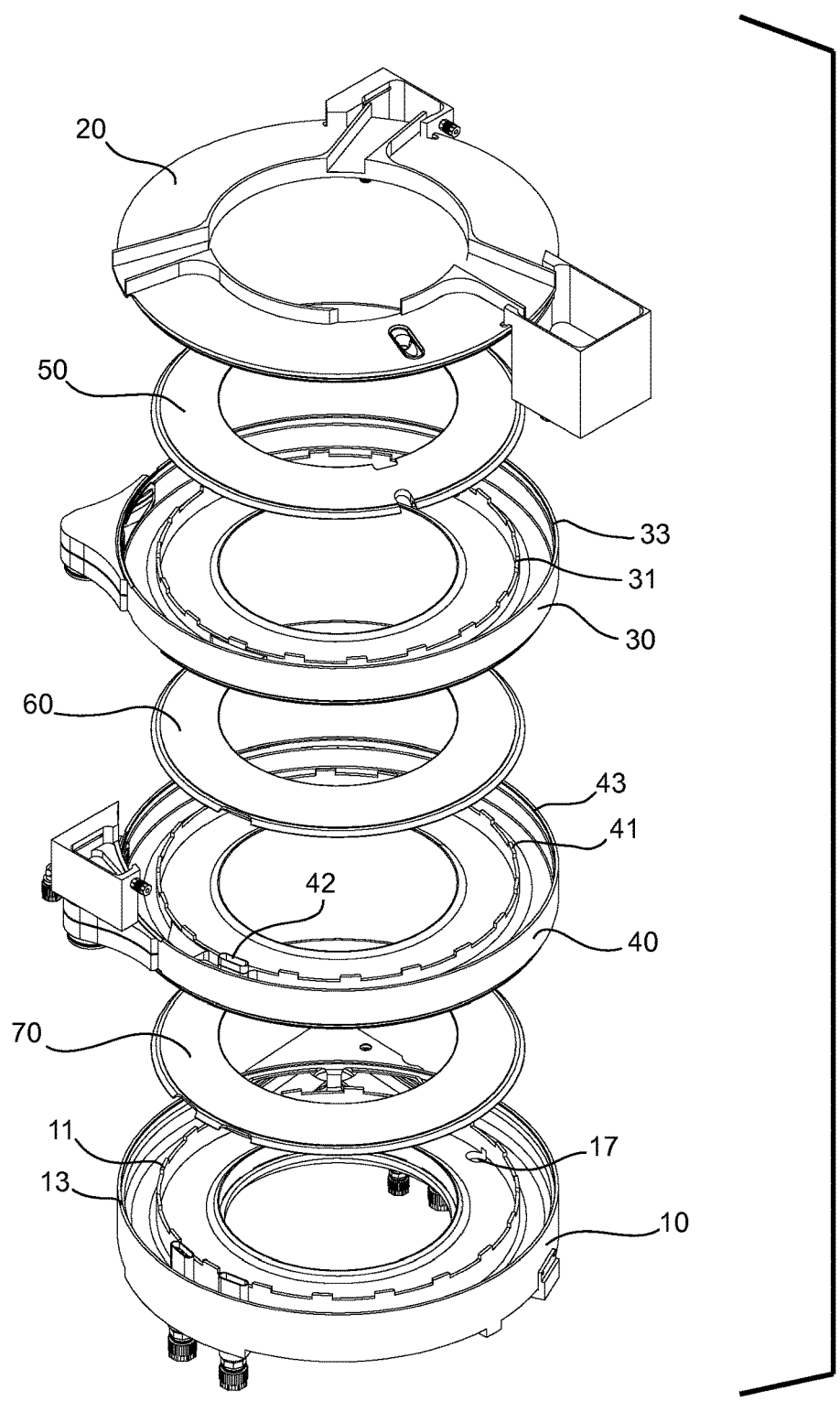
FIG. 2 is an exploded perspective view of the collector assembly of FIG. 1.

As can be seen in FIG. 2, the base component 10, first intermediate component 30, and second intermediate component 40 each comprise a respective upstanding wall 11, 31 and 41, that serves to divide its corresponding component into an inner annular trough for collecting used process liquids, and an outer annular duct for receiving exhaust gases. Also visible in FIG. 2 is the drain 17 formed in the base component 10, with each of the first and second intermediate components likewise being provided with at least one such drain, such as the drains 32 shown in FIG. 1.

As also shown in FIG. 2, the base component 10, first intermediate component 30, and second intermediate component 40 each comprise a respective upstanding outer wall segment 13, 33 and 43, that together define the outer wall of the collector assembly and which also form the outer side walls of the exhaust ducts of the collector assembly. It will be appreciated from FIGS. 1 and 2 that, in the assembled condition, the wall segments 13, 33 and 43, as well as the outer edge of top component 20, engage with one another in a gas-tight manner, through the use of inserted O-rings or other appropriate seals.

Furthermore, as shown in FIG. 1, the exhaust ducts 39, 49 formed in the first and second intermediate components 30, 40, respectively, are closed in their cross-section, such that the exhaust from each level may if desired be segregated from the exhaust in all other levels. This arrangement furthermore permits the exhaust flow rate in each level to be controlled independently of the exhaust flow rate in all other levels, through the use of individual vacuum pumps, individual valves or a combination of these, to prevent vertical pressure gradients within the collector assembly that might otherwise lead to cross-contamination among the superposed process levels.

Figure 3:
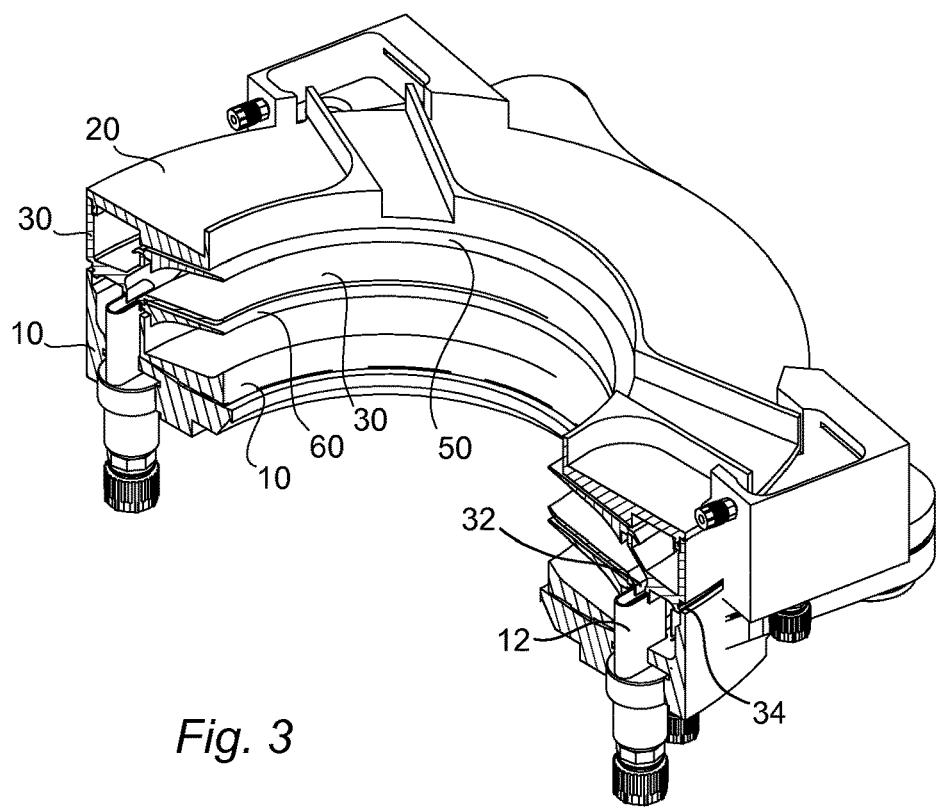
FIG. 3 is a perspective view of a collector assembly in axial cross-section, according to a second embodiment of the present invention.

Turning now to FIG. 3, the collector of this embodiment has only two process levels rather than three. However, with reference to the preceding embodiment, it will be appreciated that the two-level collector assembly of FIG. 3 is formed simply by removing the second intermediate component 40 and the lower deflector 70 of the preceding embodiment, and reassembling the remaining components such that the first intermediate component 30 now engages directly with the base component 10, whereas the option deflector 60 is now fitted between the first intermediate component 30 and the base component 10.

Drains 32 in the first intermediate component 30 function as in the preceding embodiment, but in the present embodiment they are connected directly to the conduits 12 in base component 10, rather than via the conduits 42 in the now absent second intermediate component 40. Also designated in FIG. 3 is an exemplary O-ring 34 for sealing the mating edges of first intermediate component 30 and base component 10, it being understood that similar seals will be provided at the connections of all other outer wall segments.

Figure 4:
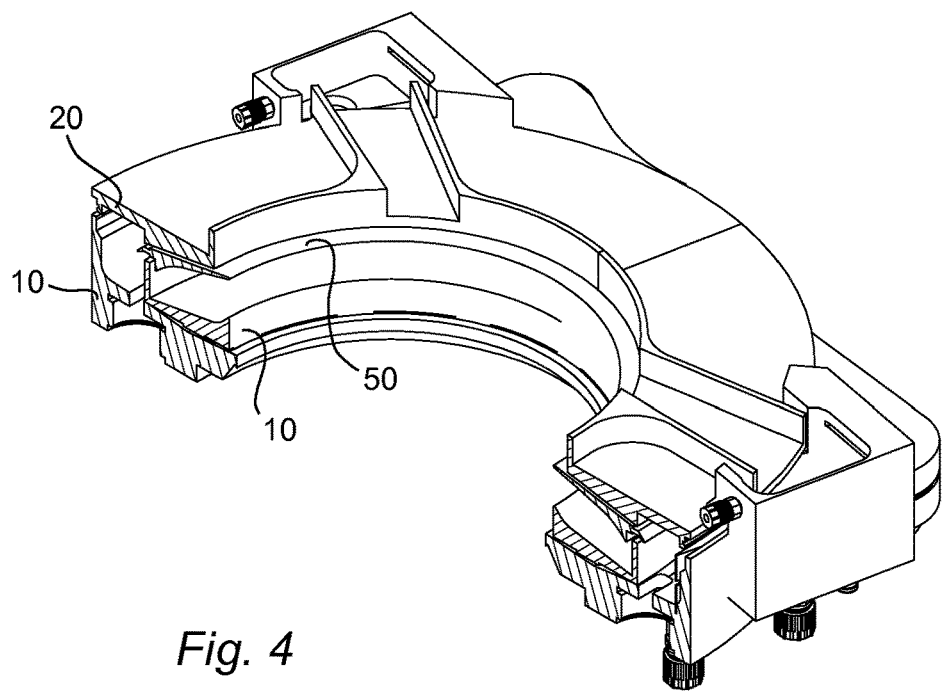
FIG. 4 is a perspective view of a collector assembly in axial cross-section, according to a third embodiment of the present invention.

Referring now to FIG. 4, in this third embodiment of a collector assembly according to the present invention, only one process level is present. Once again, this embodiment is created merely by removing selected components from the preceding embodiment, namely, the first intermediate component 30 and the middle deflector 60, and by appropriately re-assembling the remaining components such that the lower outer edge of top component 20 engages directly with the upper edge of the wall segment 13 of base component 10. Conduits 12 have been removed in this embodiment as there is now no upper process level drain to require the presence of those conduits. Process liquid is instead discharged exclusively through the drain(s) 17 of the base component 10.

Common to each of the three embodiments just described is that the single common outer collector wall of the prior art structures has been replaced by a plurality of chamber wall segments, one on the base components and one on each of the intermediate components. Consequently, a smaller number of parts provides the same function, with the advantage that for example a 3-level chamber can be easily converted into a 2-level chamber.

Each intermediate component 30, 40 constitutes the floor of the upper process level as well as the ceiling of the lower level. Each intermediate component furthermore has two concentric upwardly projecting cylindrical wall segments, namely, the outer wall segment that constitutes the outer sidewall segment and an inner wall segment that constitutes the separation wall of the inner liquid collecting trough from the outer exhaust duct.

In the embodiment of FIGS. 1 and 2, the first and second intermediate components 30, 40 may be identical to one another, whereas in the embodiment of FIG. 3 has one intermediate component 30 and the embodiment of FIG. 4 there is no intermediate component. In each embodiment the first intermediate component has a downwardly facing surface that has a similar shape as the second intermediate component so that the downwardly facing surface of the first intermediate component fits into the upwardly facing surface of the second intermediate component, so that the outer chamber wall segments tightly seal towards the downwardly facing surface of the upper chamber ring, and the separation walls 13, 33, 43 provide openings between the liquid duct and the annular collecting chamber.

Figure 5:
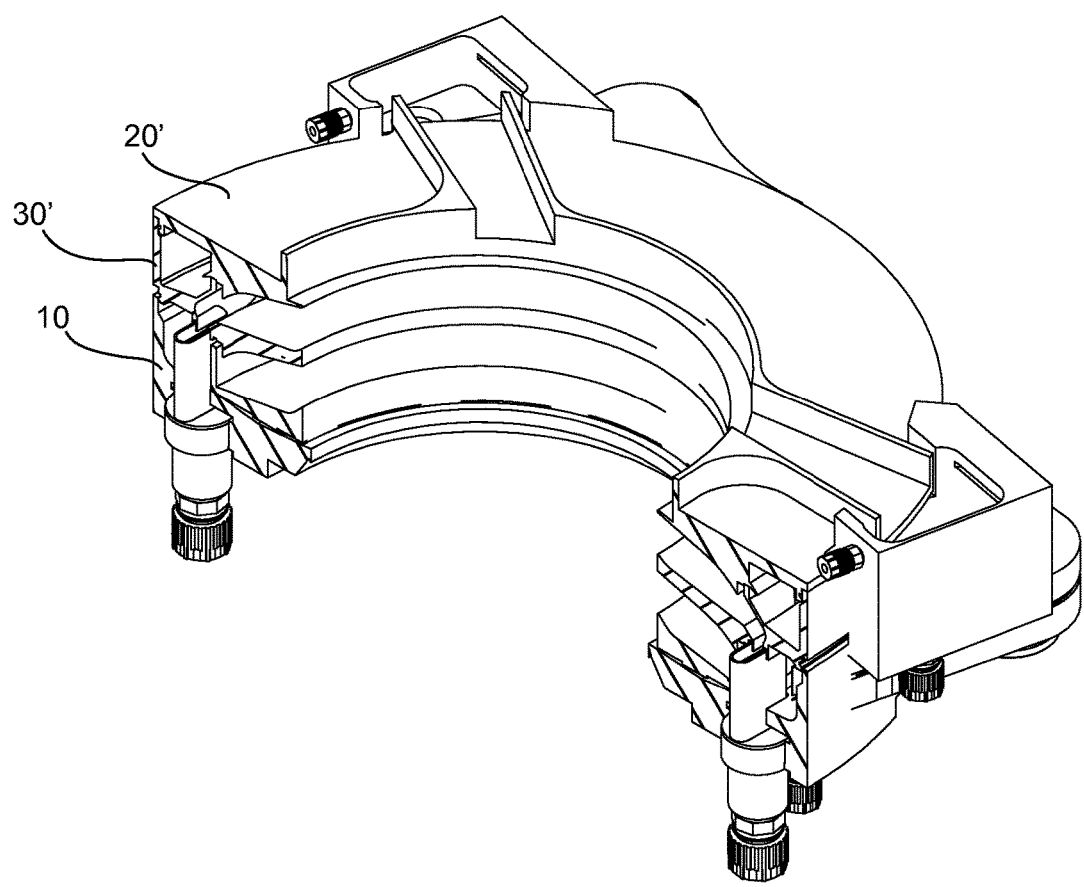
FIG. 5 is a perspective view of a collector assembly in axial cross-section, according to a fourth embodiment of the present invention.

As noted previously, deflectors 50, 60 and 70 are optional. In the preceding embodiments, one or more of these deflectors is provided to aid in routing exhaust gases, as described previously. However, it is also possible to form such deflectors integrally with the top component 20, first intermediate component 30, and second intermediate component 40, respectively. FIG. 5 illustrates that alternative approach as applied to the two-level collector configuration, although the corresponding structure of the three-level and one-level variants can be readily envisioned.

In particular, in FIG. 5, the top component 20' has been modified to incorporate the previous upper deflector 50, and the first intermediate component 30' has been modified to incorporate the previous middle deflector 60.

In the first three embodiments, the deflectors 50, 60, 70 have an inner diameter corresponding to the inner diameter of the chamber, and an outer diameter, which corresponds to the diameter of the separation wall. The deflectors 50, 60, 70 are mounted at a distance from the downwardly facing surface of the adjacent upper component, and thus provide a small gap therebetween (preferably 1 mm-5 mm). That gap is inwardly open towards the inner volume of the collector and is outwardly in fluid connection to the respective annular exhaust duct.

The exhaust ducts can be in fluid connection with each other so that gas can be conjointly collected from all exhaust ducts. Alternatively, the exhaust ducts may be sealed off from each other so that the gas from each exhaust duct can be separately collected and thus separately exhausted, which is especially helpful if chemically incompatible gases are to be collected.

The present invention thus provides a new collector design that allows the number of liquid collecting levels to be changed very easily. The ability to be able to remove each level separately for cleaning is considered to be beneficial in view of the very limited clearance expected for the next generation treating apparatus.

While the present invention has been described in connection with various preferred embodiments thereof, it is to be understood that those embodiments are provided merely to illustrate the invention, and should not be used as a pretext to limit the scope of protection conferred by the true scope and spirit of the appended claims.

What is claimed is:

1. A collector assembly for use with a spin chuck, said collector assembly comprising a base component, a top component and a first intermediate component configured to be fitted between said base component and said top component, wherein said base component, top component and first intermediate component are configured so as to be interconnectable to form a process enclosure and so as to be separable from one another, said base component and said first intermediate component each comprising collector wall segments such that when said base component, top component and first intermediate component are interfitted, said collector wall segments together define an outer side wall of said collector assembly, and said process enclosure is open to a central area surrounded by said collector assembly.

2. The collector assembly according to claim 1, wherein said base component comprises a radially inner trough for collecting process liquid and a radially outer annular duct for collecting exhaust process gas.

3. The collector assembly according to claim 2, further comprising an exhaust system for venting exhaust gases from said radially outer annular duct of said base component, and said first intermediate component, wherein said radially outer annular duct of said base and first intermediate components are sealed off from one another, and wherein said exhaust system is configured to withdraw exhaust gas separately and independently from said radially outer annular duct of said base and first intermediate components.

4. The collector assembly according to claim 2, further comprising an exhaust system for venting exhaust gases from said radially outer annular duct of said base component, and said first intermediate component, wherein said radially outer annular duct of said base and first intermediate components are in gaseous communication one another, and wherein said exhaust system is configured to withdraw exhaust gas separately and conjointly from said radially outer annular duct of said base and first intermediate components.

5. The collector assembly according to claim 1, wherein a lower portion of said top component is formed as a deflector having a downwardly facing annular surface that directs process fluids radially outwardly and downwardly toward a drainage channel formed in said collector assembly.

6. The collector assembly according to claim 1, further comprising an upper deflector fitted between said top component and said first intermediate component, said upper deflector having a downwardly facing annular surface that directs process fluids radially outwardly and downwardly toward a drainage channel formed in said collector assembly.

7. The collector assembly according to claim 1, wherein a lower portion of said first intermediate component is formed as a deflector having a downwardly facing annular surface that directs process fluids radially outwardly and downwardly toward a drainage channel formed in said collector assembly.

8. The collector assembly according to claim 1, further comprising a lower deflector fitted between said first intermediate component and said base component, said lower deflector having a downwardly facing annular surface that directs process fluids radially outwardly and downwardly toward a drainage channel formed in said collector assembly.

9. The collector assembly according to claim 1, wherein said first intermediate component is configured so as to sealingly interfit at an upper end with said top component and to sealingly interfit at a lower end with said base component.

10. The collector assembly according to claim 1, further comprising a second intermediate component configured so as to sealingly interfit at an upper end with a lower end of said first intermediate component and to sealingly interfit at a lower end with said base component, said second intermediate component comprising a further collector wall segment such that when said base component, top component and first and second intermediate components are interfitted, said collector wall segments together define an outer side wall of said collector assembly.

11. The collector assembly according to claim 10, wherein said second intermediate component comprises a radially inner trough for collecting process liquid and a radially outer annular duct for collecting exhaust process gas.

12. The collector assembly according to claim 10, further comprising at least one drain conduit fitted in a radially outer annular duct of said base component and having an upper end configured to interfit with a lower end of a drain conduit formed in said second intermediate component, said drain conduit of said second intermediate component being configured to interfit with a drain formed in a radially inner trough of said first intermediate component, such that process liquid collected by said first intermediate component passes through said radially outer annular duct of said second intermediate component and said base component without being exposed to exhaust gases in said radially outer annular duct of said second intermediate component or said base component.

13. The collector assembly according to claim 10, wherein said second intermediate component comprises an upstanding partition dividing a radially inner trough of said second intermediate component from a radially outer annular duct of said second intermediate component.

14. The collector assembly according to claim 1, wherein said first intermediate component comprises a radially inner trough for collecting process liquid and a radially outer annular duct for collecting exhaust process gas.

15. The collector assembly according to claim 1, further comprising at least one drain conduit fitted in said radially outer annular duct of said base component and having an upper end configured to interfit with a drain formed in said radially inner trough of said first intermediate component, such that process liquid collected by said first intermediate component passes through said radially outer annular duct of said base component without being exposed to exhaust gases in said radially outer annular duct of said base component.

16. The collector assembly according to claim 1, wherein said base component comprises an upstanding partition dividing a radially inner trough of said base component from a radially outer annular duct of said base component.

17. The collector assembly according to claim 2, wherein said first intermediate component comprises an upstanding partition dividing said radially inner trough of said first intermediate component from said radially outer annular duct of said first intermediate component.

* * * * *